United States Patent
Campanale et al.

(10) Patent No.: US 6,625,706 B2
(45) Date of Patent: Sep. 23, 2003

(54) ATD GENERATION IN A SYNCHRONOUS MEMORY

(75) Inventors: Fabrizio Campanale, Bari (IT); Salvatore Nicosia, Palermo (IT); Francesco Tomaiuolo, Monte Sant'Angelo (IT); Luca Giuseppe De Ambroggi, Catania (IT); Promod Kumar, Motta S. Anastasia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 414 days.

(21) Appl. No.: 09/773,760

(22) Filed: Jan. 31, 2001

(65) Prior Publication Data

US 2001/0029563 A1 Oct. 11, 2001

(30) Foreign Application Priority Data

Jan. 31, 2000 (EP) .............................. 00830068
Apr. 27, 2000 (EP) .............................. 00830313

(51) Int. Cl.[7] ................................. G11C 7/00
(52) U.S. Cl. ..................... 711/167; 711/1; 711/157; 365/233.5; 365/185.17; 365/222
(58) Field of Search ............. 711/1, 157, 167; 365/233.5, 185.17, 222

(56) References Cited

U.S. PATENT DOCUMENTS

| 5,559,990 | A | | 9/1996 | Cheng et al. ............... 711/157 |
| 5,596,539 | A | | 1/1997 | Passow et al. .............. 365/210 |
| 5,657,269 | A | * | 8/1997 | Nanamiya ............... 365/185.17 |
| 5,696,917 | A | * | 12/1997 | Mills et al. ..................... 711/1 |
| 5,859,623 | A | * | 1/1999 | Meyn et al. ................. 345/730 |
| 5,912,860 | A | * | 6/1999 | Schaefer .................. 365/233.5 |
| 5,963,504 | A | * | 10/1999 | Manning .................. 365/233.5 |
| 5,966,724 | A | | 10/1999 | Ryan .......................... 711/105 |
| 6,470,431 | B2 | * | 10/2002 | Nicosia et al. .............. 711/157 |

FOREIGN PATENT DOCUMENTS

| EP | 0561370 | 9/1993 | ............ G11C/7/00 |
| EP | 0961283 | 12/1999 | ............ G11C/7/00 |

* cited by examiner

*Primary Examiner*—Donald Sparks
*Assistant Examiner*—Mehdi Namazi
(74) *Attorney, Agent, or Firm*—Lisa K. Jorgenson; Allen, Dyer, Doppelt, Milbrath & Gilchrist, P.A.

(57) ABSTRACT

A method of synchronizing the start of sequential read cycles when reading data in a memory in a synchronous mode with sequential access uses the increment pulses as synchronization signals for the address counters of the memory cell array. Following each increment pulse, a dummy ATD pulse is generated. The dummy ATD pulse is undistinguishable from an ATD pulse generated upon detection of a switching of external address lines.

26 Claims, 7 Drawing Sheets

ATD GENERATION IN A SYNCHRONOUS MEMORY

FIELD OF THE INVENTION

The present invention relates in general to memory devices, and in particular, to an interleaved memory readable in a synchronous mode or in a random access asynchronous mode with fast access times. The interleaved memory is readable in the synchronous mode by successive locations with a sequential type of access, commonly referred to as a burst mode.

BACKGROUND OF THE INVENTION

In a standard non-volatile memory, a read cycle spans from a request of data by way of the switching of the input address lines to the final extraction of the bits stored in the addressed memory location. In particular, in modern devices, the read circuitry (references, sense amplifiers, etc.) is disabled at the end of each read cycle in order to minimize energy consumption. Therefore, the start of a new reading must be triggered by the generation of a suitable signal (Address Transition Detection pulse or briefly ATD) that is generally produced by a circuit sensing a change of the input address.

A typical ATD pulse generator is depicted in FIG. 1. The ATD pulse must satisfy fundamental requirements for a correct reading and for satisfying the access time requirements. In fact, independent from the particular architecture of the read circuitry, the ATD must be generated as quick as possible in order to quickly restart the whole analog sensing networks.

That is why it is important to generate the ATD immediately after the input buffer of the address bits. In this way, the time required for the address bits to propagate through the decoding circuitry down to select the addressed cells is simultaneously exploited to re-establish the bias conditions for an optimal reading. It should be noted that the assumption from outside of a new address and the consequent generation of a new ATD before a previous access is finished, causes interruption and suppression of the previously started read cycle and the immediate start of a new read cycle. This superimposes to the first one, thus substituting it.

In "burst" memory devices, i.e., operating in a sequential reading mode, only the first reading, whose address is not predictable, must follow a standard data path. On the contrary, for successive cycles it is necessary to follow a different path. Unlike a standard memory, in a synchronous memory the addresses successive to the first one of random access (asynchronous) are internally generated by a counter incremented by a pulse coherently with the system's clock.

In particular, in a synchronous memory device it is necessary to start the sequential reading, successive to the first reading, and synchronize it by internally generating the addresses, which is updated in a sequential manner. A common ATD pulse generator is unsuitable because the external address lines do not switch (or are not accessible to the memory device) during synchronous read cycles.

It is also true that if a generic signal, untied from the internal address being generated, was used for starting sequential readings, the sensing circuit would become independent from the decoding circuitry. This would run the risk of anticipating or delaying the start of the reading with respect to the correct selection of the memory cells to be sensed.

In order to avoid the problem, at the start of the sequential accesses, the eventual propagation of the internally generated addresses (by introducing an appropriate delay) could be waited for. But in doing so, besides the cost in terms of silicon area required for such a delay chain, the control logic of the sense-amp would be greatly complicated because it will be necessary to implement two alternative data streams for the two different kinds of access: a random-asynchronous mode and a sequential-synchronous mode.

A different approach could be that of placing the ATD generation circuit in cascade of the counter that generates the internal addresses, instead of in cascade of the input address buffer. This is done to always generate the pulses at the same point of the control chain, independently of the kind of access in progress. During the asynchronous reading the counter works as a register because the internal and external addresses coincide.

Unfortunately, this approach burdens the read path in an opposite manner because instead of starting the logic chain when a new reading has been acquired (because a change of address having been detected downstream of the input buffers), it is necessary to wait for the propagation of the signals through the latches of the counter. This increases the total access time.

SUMMARY OF THE INVENTION

In view of the foregoing background, the present invention provides an approach using an ATD signal even for starting sequential readings, by causing its generation when the start of a new cycle of synchronous readings with sequential access is detected.

The most appropriate signal to provide such information is the increment pulse for the internal address counter. In fact, by detecting this increment pulse it is possible to generate a pseudo ATD signal, i.e., stimulated by an internal cause and not by the switching of the external address lines. This starts a new reading.

The final architecture maintains the classical structure of ATD generation, with circuits sensing the external address lines (useful for all conventional accesses) and sensing the pulses of sequential increment of an internal address counter, and generating the ATD pulses for starting sequential readings.

Finally, the two kinds of ATD pulses, a first kind due to external cause and the other kind due to internal cause can be summed by a logic output OR gate of the ATD generator. Therefore, the method of the invention for synchronizing the start of sequential readings for a read cycle of a memory in burst synchronous mode includes using the increment pulses of the address counter, or of the address counters in the case of interleaved memory devices, as synchronization signals, by generating after each increment pulse a dummy ATD pulse. The dummy ATD pulse is practically undistinguishable from an ATD pulse generated by an effective switching of the input address latches.

According to an aspect of the memory architecture of the present invention, an ATD pulse generator conventionally sensing the external address lines is used, but modified to include at least a pulse generator circuit stimulated by an increment pulse synchronized by a respective address counter.

According to a preferred embodiment, in the case of an interleaved memory, the method of the invention can advantageously contemplate the fact that the increment pulses are distinct for the counter of one of the banks of the array of cells of the interleaved memory. The distinct increment pulses produced corresponds to distinct dummy ATD pulses for starting sequential readings in the respective subdivided banks of the array of cells of the interleaved memory.

An external protocol signal (ALE), or more generally, an equivalent command ENABLE for enabling the input latch or latches of acquisition of external input addresses determines, as a function of its logic state, the generation of ATD pulses common to both the subdivided banks of the matrix (array) of cells of the interleaved memory. This is done for read cycles in a random access asynchronous mode or, according to the invention, the generation of dummy ATD pulses specifically for one of the subdivided banks of the matrix of cells of the interleaved memory for a synchronous read cycle in burst access.

The ALE signal establishes that it is necessary to start a read cycle from an external address. For such a cycle, either the first random cycle of a sequence of burst readings or a generic asynchronous access, the ATD pulse stimulated by the switching of the external address lines is sent to all the banks, which will then enable their respective read structures.

If the access were purely asynchronous, both banks will terminate the readings, but only the bank effectively addressed by the external address shall output its data. Bank priority is defined by the least significant bit A<0> of the address, as already explained.

In contrast, because of the switching back to a low level of the signal ALE, should the read cycle be interpreted as being the first random cycle of a burst sequence, the control logic of the memory will generate a first increment pulse for the address counter of the bank (or banks) that is not in priority, such as the bank ODD, for example. This is done to generate the address on which the following (second) reading will be carried out.

Using as a stimulation the increment pulse, intended to one of the internal address counters, a new dummy ATD pulse is generated to start a new read cycle on the ODD bank, i.e., on the bank whose internal address is being incremented. In this way, the reading on the bank EVEN is left to evolve. By way of a new dummy ATD pulse, following the generation of an internal address counter increment pulse, the reading on the other bank ODD is restarted with the updated internal address.

At the end of a first random access cycle (that is, only after having output the data read during the first random access cycle on the EVEN bank), a new increment pulse INC_E will be generated. This pulse is intended for the address counter of the EVEN bank on which the reading has just terminated.

Again, by using the address counters increment pulse, a new ATD pulse dedicated to the bank EVEN will be generated to restart a new reading, while the ODD bank, having acquired priority from the control logic, will be completing the reading cycle as far as to output of the read data. Basically, by continuing to produce increment pulses alternately for the respective address counters, dedicated ATD pulses are coordinately generated to start the readings on the two banks in an alternate fashion.

BRIEF DESCRIPTION OF THE DRAWINGS

The different aspects and advantages of the invention will become clearer through the following description of several embodiments with reference to the attached drawings, in which.

DETAILED DESCRIPTION OF THE PREFERRED EMBODIMENTS

Figure 1:
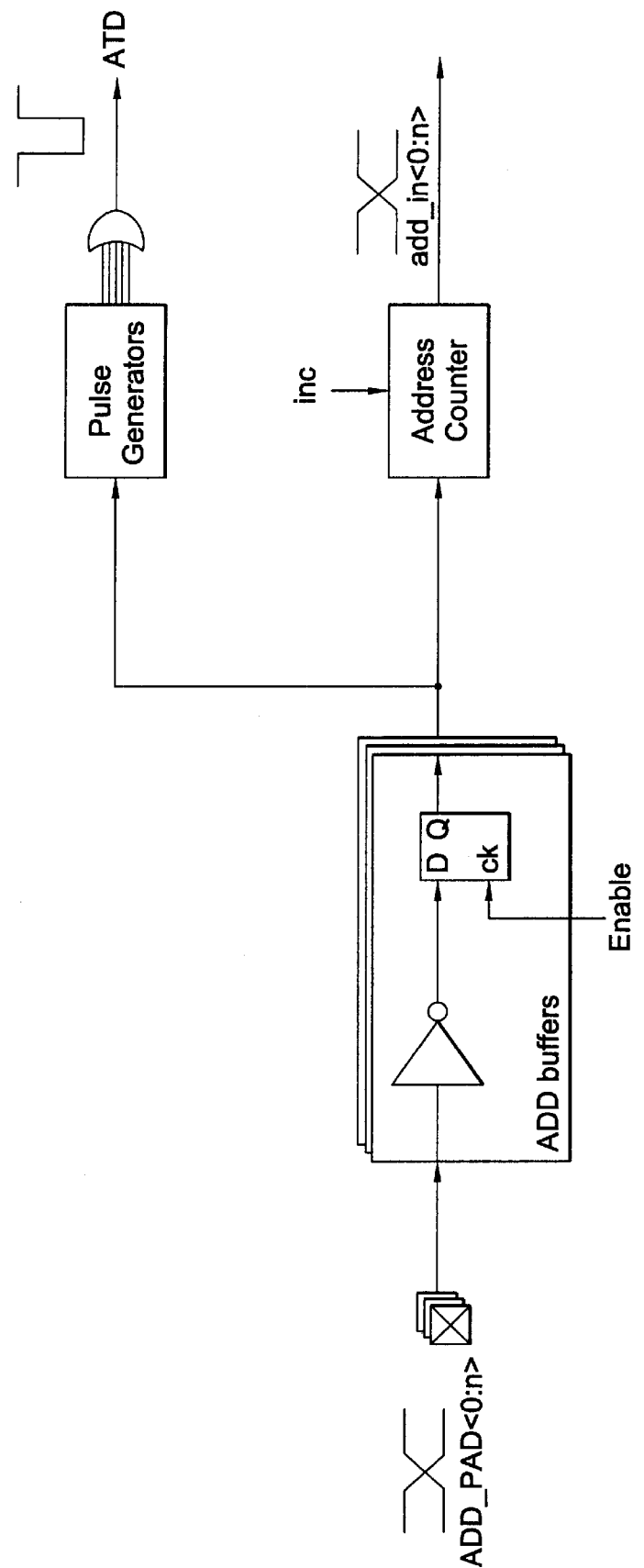
FIG. 1 shows a classical structure for generating ATD pulses from the switching of external addresses according to the prior art.
Figure 2:
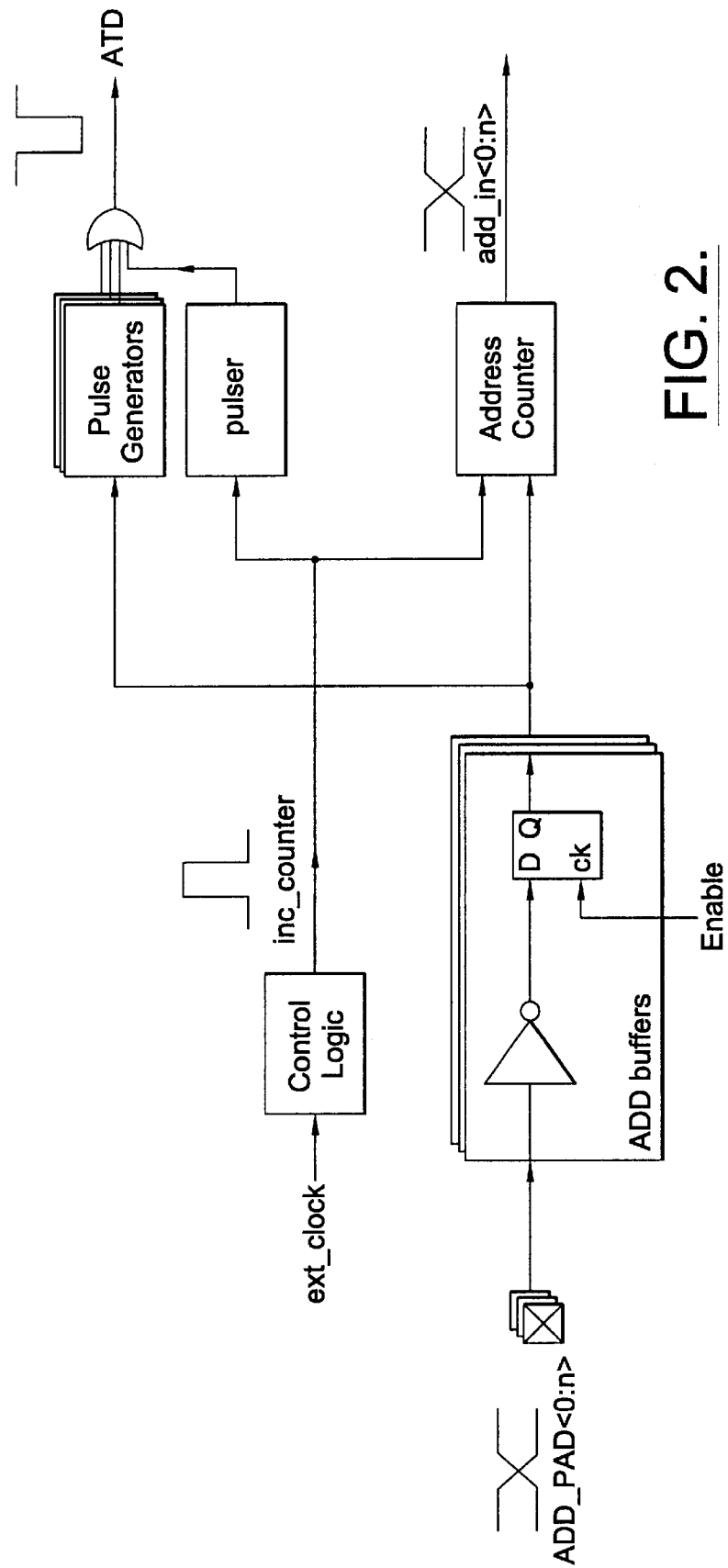
FIG. 2 is a basic diagram of the architecture for generating ATD pulses for synchronous memories according to the present invention.

The basic diagram of the architecture of the invention for a synchronous memory is depicted in FIG. 2. By comparing it to the conventional architecture of FIG. 1, the increment pulse of the address counter is identified as INC_COUNTER.

In addition to the function of incrementing the counter or the counters of the internal addresses, it stimulates, by way of a suitable pulse generator circuit (PULLER), the generation of a dummy ATD signal. At the output formed by an OR logic gate, the dummy ATD pulse that results is substantially undistinguishable from the ATD pulses produced by the array of pulse generators, PULSE GENERATOR, because of a switching of the registers of external addresses. The block CONTROL LOGIC represents the logic circuit that generates the increment pulse INC_COUNTER, immediately after the detection of a rising edge of a synchronization signal of the synchronous readings, indicated as EXT_CLOCK in the diagram.

Figure 3:
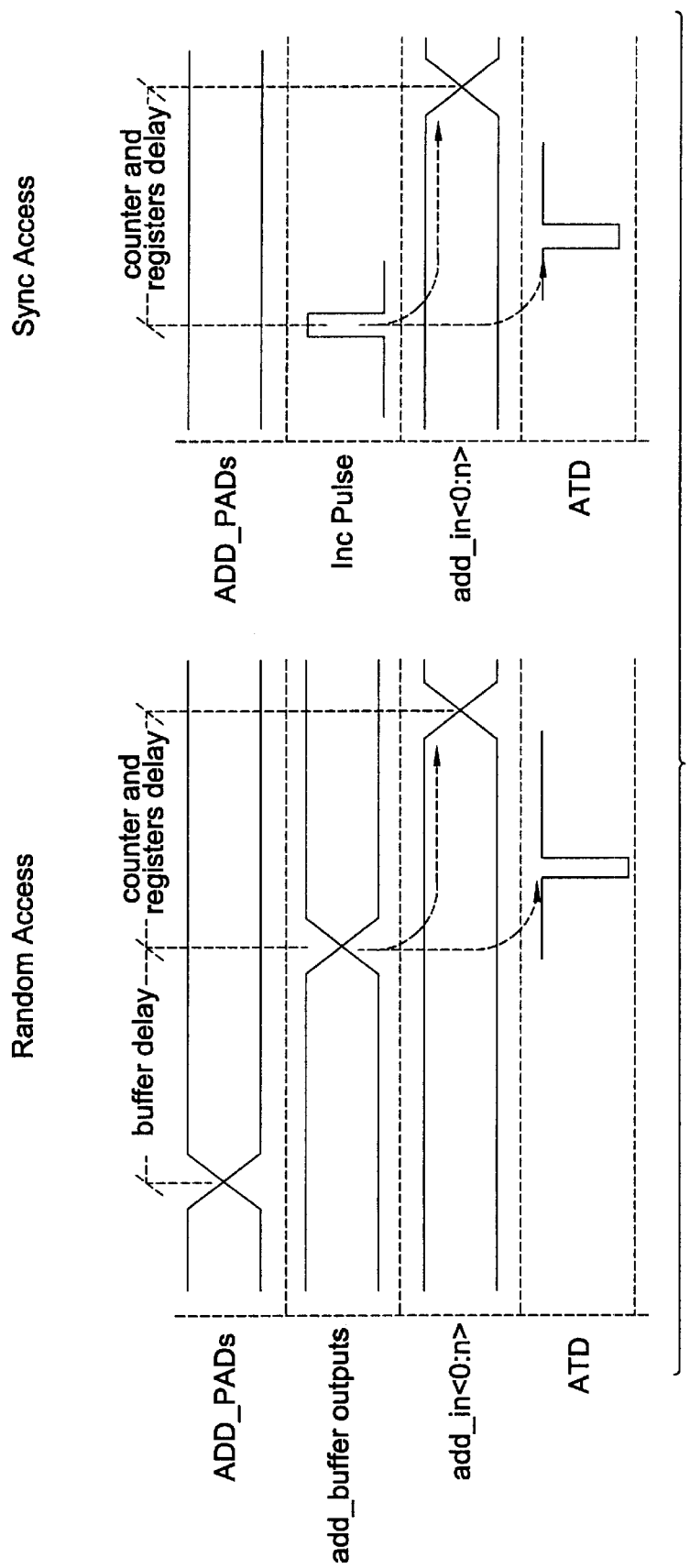
FIG. 3 illustrates graphically the ATD pulse generation processes in the case of a random access and in the case of sequential access (burst) according to the prior art.

The functioning of the circuit of the invention of FIG. 2 is diagrammatically depicted in FIG. 3 in the case of a random access (RAND ACCESS) and in the case of a sequential read cycle (SYNC ACCESS). A fundamental advantage of the architecture of the invention includes making the path of the ATD signal be the same both in the case of a sequential reading and in the case of a random access asynchronous reading.

In fact, the generation of the ATD pulses takes place during the same logic phase of a reading, that is, when the latches that form the internal address counter are stabilizing themselves. This is whether the address is input from outside or it is internally generated through an incrementing of the counter itself. In this way, the same propagation delay of the ATD pulses that would be experienced during a standard random access read cycle is ensured also in case of sequential synchronous reading cycles.

Fulfillment of this important condition may be easily verified by looking at the diagrams of FIG. 3. Although such increment pulses could be used ATD pulses for readings successive to the first one, in this case it would be necessary to tie the duration of the ATD pulse, from which depends the timing of the reading and thus the access time, to the duration of the increment pulse. On the contrary this signal may be dictated by the particular structure and by the characteristics of the internal address counters. As a consequence, the access time would be made unduly dependent from the characteristics of the address counters.

In interleaved memory devices only the first reading, whose address is not predictable, must follow the standard data path. On the contrary, for cycles successive to the first one, it is necessary to follow an alternative (interlaced) data path to exploit the contiguity condition. That is, the fact that the successive cell to be read is adjacent to the one currently being read, and thus its address is predictable.

Figure 4:
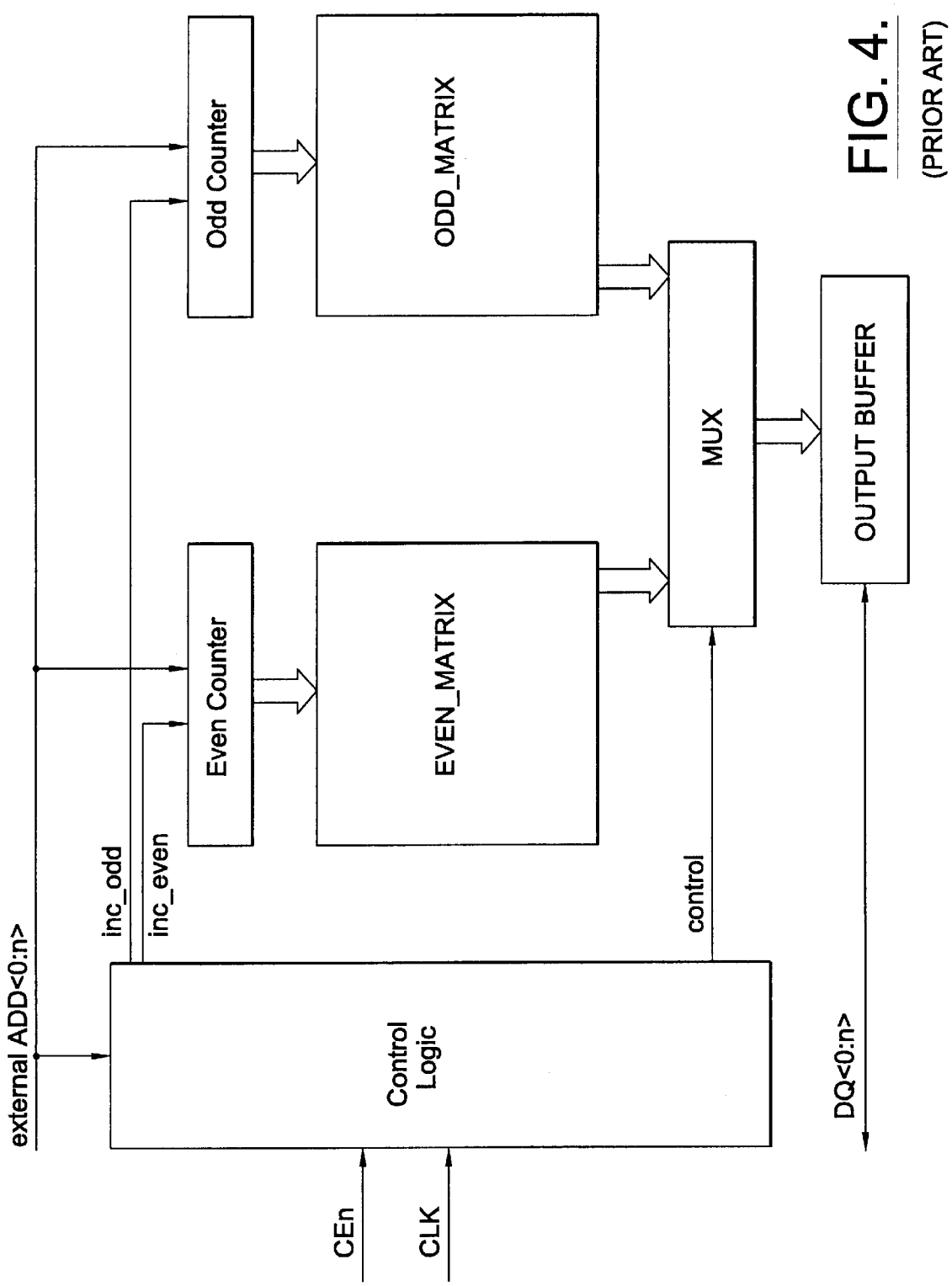
FIG. 4 shows a simplified block diagram of an interleaved memory according to the prior art.

A simplified block diagram of a typical two-bank interleaved memory is depicted in FIG. 4. In this type of memory devices the matrix is divided into two independent banks, EVEN MATRIX and ODD MATRIX, each one having its own read path structure. The read cycles of the two banks may then superimpose to one another even though they are out of phase. While on one of the two banks evaluation and transfer of the data to the output is being carried out (OUTPUT BUFFER), on the other bank (by virtue of the fact that the location to be addressed is known) it is possible to start a new reading without waiting for the conclusion of the reading in progress on the first one.

By way of a control signal, CONTROL, tied to the external synchronization clock, it is possible to manage the multiplexing with respect to the output MUX, alternating the priority from one bank to the other. Therefore, for readings successive to the first one, in order to exploit the contiguity of addresses it is necessary to generate addresses internally by the respective counters, EVEN COUNTER and ODD COUNTER. These counters are incremented coherently with the system's clock by the respective increment pulses INC_EVEN and INC_ODD.

Figure 5:
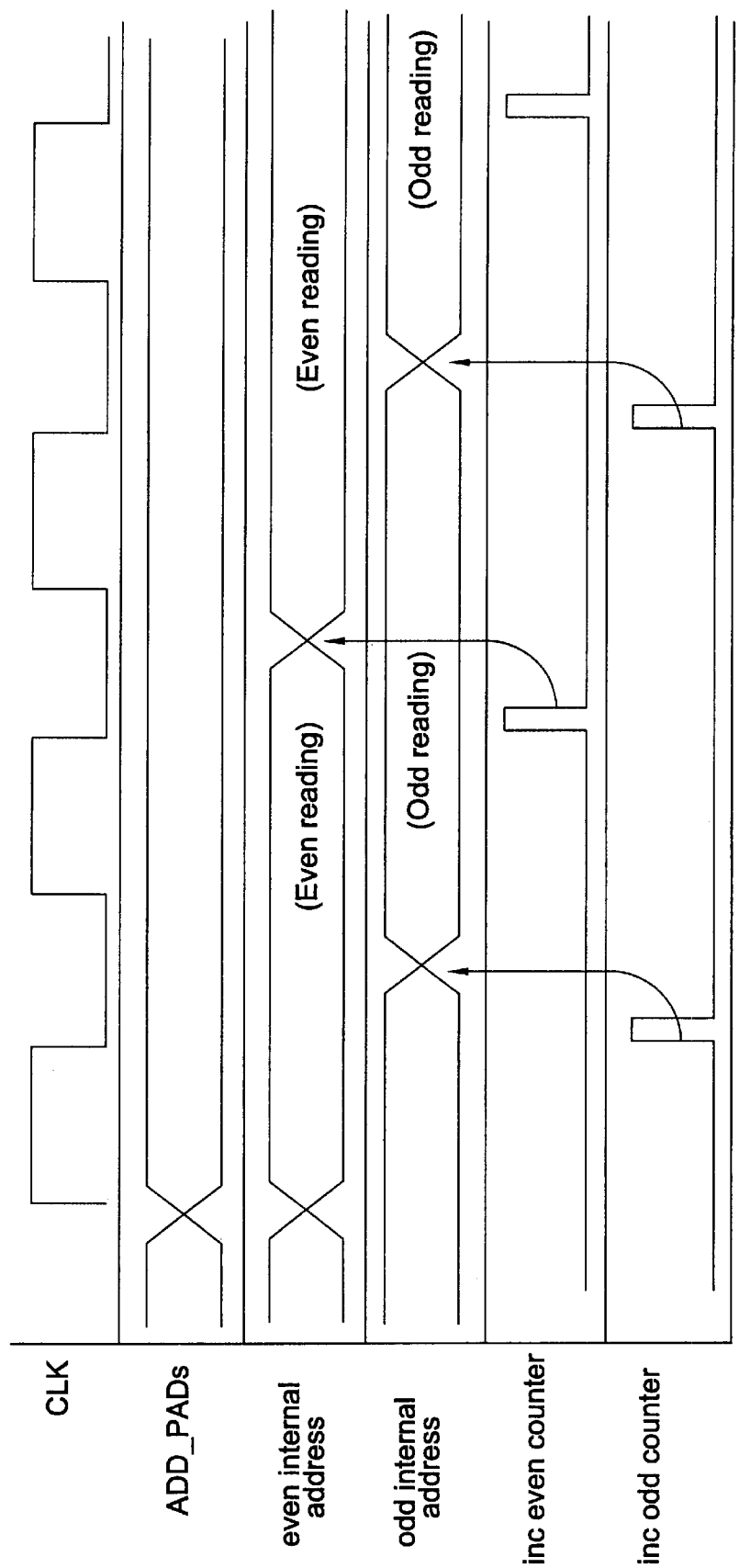
FIG. 5 illustrates graphically the dependence between the increment pulses and the generation of internal addresses for the two banks of an interleaved memory according to the prior art.
Figure 6:
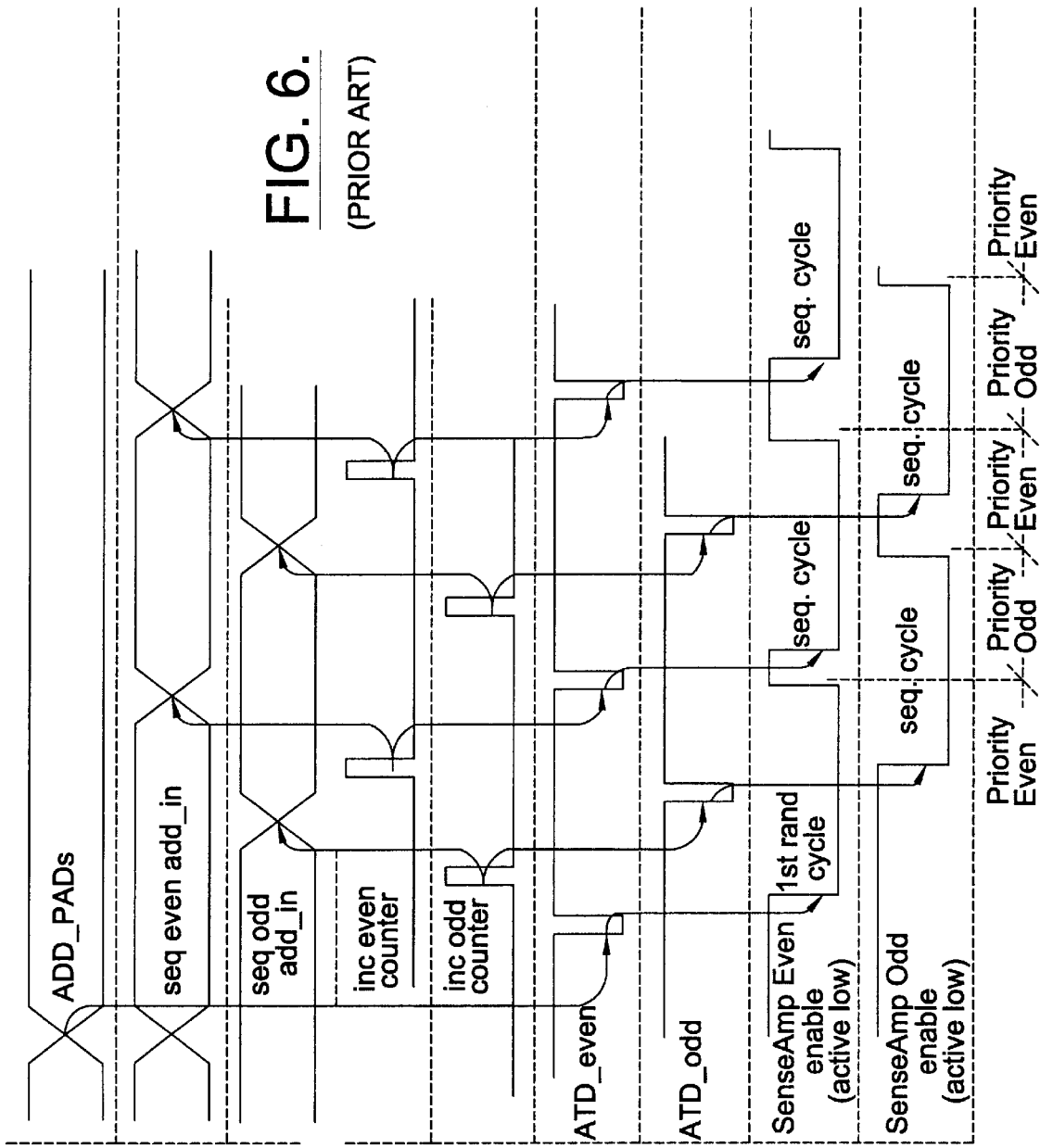
FIG. 6 shows the time evolution of the main signal involved in the ATD pulse generation according to the prior art.

The dependence among the specific increment pulses and the generation (sequential updating) of the internal addresses of the two banks is graphically depicted in FIG. 5. An example of the timing of the main involved signals is depicted in FIG. 6.

Figure 7:
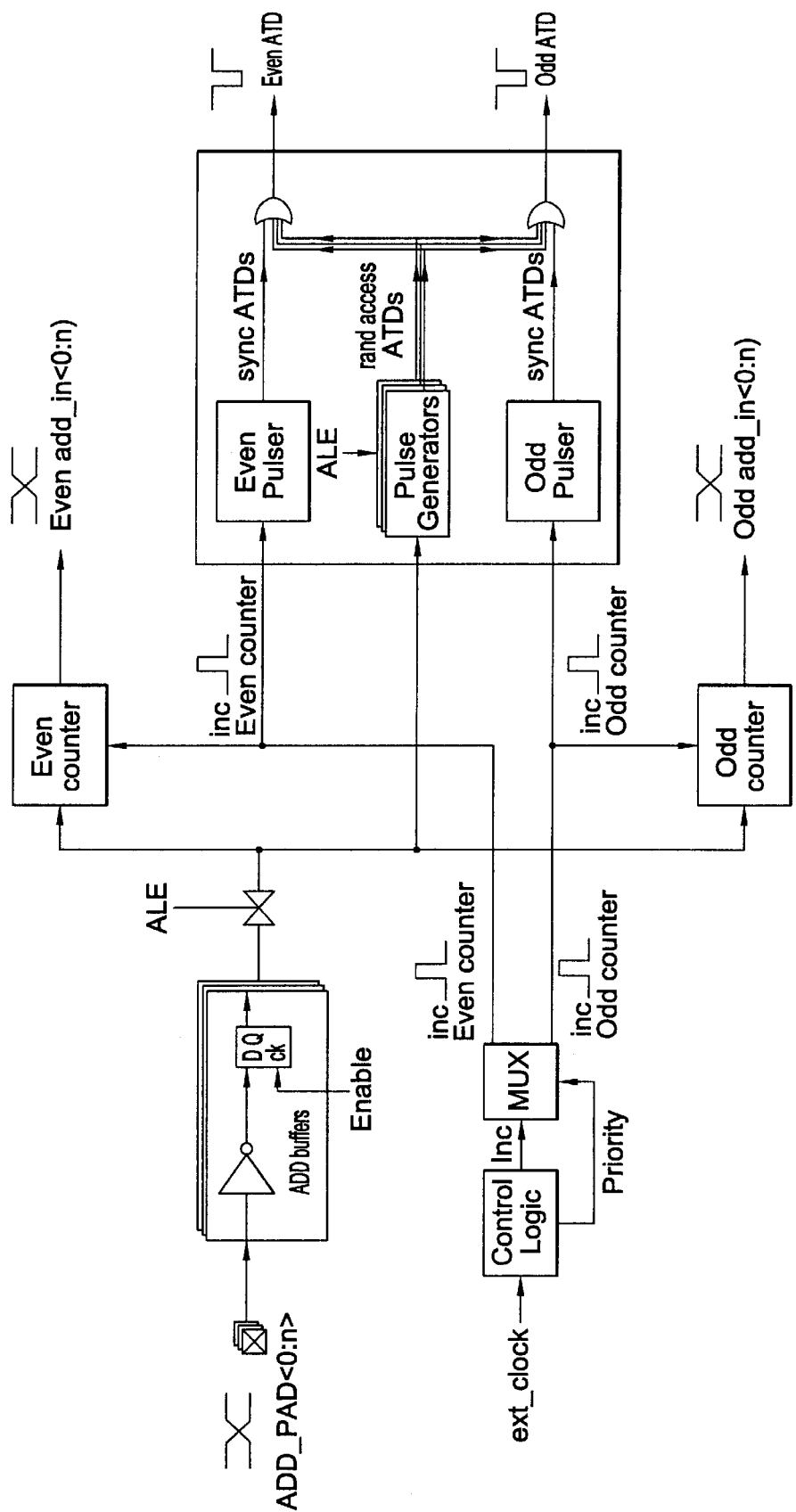
FIG. 7 is a diagram of the architecture according to an alternative embodiment that is particularly effective for interleaved memory devices according to the present invention.

According to an alternative and particularly preferred embodiment for interleaved memory devices, the basic diagram of FIG. 2 can be modified as depicted in FIG. 7. It still comprises the classic ATD pulse generation structure based on circuits sensing switching of the external address lines. The ATD pulses generated by these circuits sensing the external address lines are common for the two banks and are used for all conventional random accesses.

Substantially the structure of the ATD pulse generator of FIG. 7 comprises, instead of a single auxiliary pulse generator, two auxiliary pulse generators, EVEN PULSER and ODD PULSER. These pulse generators are stimulated by specific increment signals INC_EVEN COUNTER and INC_ODD COUNTER, respectively, for the internal address counter of the EVEN bank and for the internal address counter of the ODD band which generate specific dummy ATD pulses: EVEN_ATD and ODD_ATD for the two banks for interleaved sequential readings. During synchronous functioning in a burst mode, the generation of ATD pulses from external addresses is disabled by the presence of the external protocol signal ALE.

Also in the case of an interleaved memory, the path of the control signals (starting from the ATD pulse) in case of sequential access reading is the same of that in case of a random access reading. The generation of ATD pulses takes place in the same logic phase of a reading, i.e., when the latches that form the internal address counter are stabilizing themselves. This is whether the address is input from outside or it is internally generated through an incrementing of one of the counters.

In this way, the same propagation delay of the ATD pulses as in the case of a standard random access read cycle is ensured and this identity of propagation delays solves in a simple and effective manner the problem of ensuring a synchronized start on the two banks of burst access readings without requiring the implementation of any further control logic. Moreover, by virtue of the fact that burst access readings take place through the same mechanisms (starting from the counters increment pulses) and using the same circuits as for random access readings, there is a further guarantee of correctness of the operation and of robustness of the architecture.

An additional advantage is represented by the exploitation of the distinct increment pulses for the internal address counters of the two banks. In this way, no further processing is necessary for correctly conveying the dummy ATD pulse to one bank without affecting the other bank. The alternative of generating a common ATD pulse and successively permitting propagation only toward the correct bank would require, in practice, a further control signal for implementing the required multiplexing, e.g., a priority flag signal.

It is thus evident that the concept of using the increment pulses to synchronize the start of sequential readings through the generation of dummy ATD pulses, undistinguishable from the ones generated by a switching of the external address lines, represents altogether an extremely efficient, easy and robust approach for synchronous memory devices. In particular, this approach is for interleaved memory devices, because it allows the use of the same read control architecture and the same signal hierarchy. This is independent from the system used to generate the internal addresses and, above all, from the kind of access that is being used, whether asynchronous or sequential.

That which is claimed is:

1. A method of synchronizing starting of sequential read cycles when reading data in a memory operating in a synchronous mode with sequential access, the method comprising:

detecting switching of an external address line using an array of address buffers;

providing increment pulses as a function of an external read command to at least one address counter and to at least one pulse generating circuit; and generating a dummy ATD pulse to be used as a synchronization signal following each increment pulse using the at least one pulse generating circuit.

2. A method according to claim 1, wherein the memory further comprises an array of ATD pulse generators connected to the array of address buffers and being controlled thereby for generating an ATD pulse.

3. A method according to claim 2, further comprising performing a logic OR function using at least one logic OR gate having inputs connected to the array of ATD pulse generators for receiving the ATD pulse and an input for receiving the dummy ATD pulse.

4. A method according to claim 2, wherein the dummy ATD pulse is undistinguishable from the ATD pulse.

5. A method according to claim 2, wherein the memory is an interleaved memory having an array of memory cells being divided into a first bank of memory cells and a second bank of memory cells with each bank of memory cells including a respective address counter connected thereto; the method further comprising performing logic OR functions using a first logic OR gate and a second logic OR gate each having inputs connected to the array of ATD pulse generators for receiving the ATD pulse therefrom.

6. A method according to claim 5, wherein the at least one pulse generating circuit comprises a first pulse generating circuit for providing a first dummy ATD pulse to the first logic OR gate, and a second pulse generating circuit for providing a second dummy ATD pulse to the second logic OR gate.

7. A method according to claim 5, wherein the increment pulses are distinctly generated for each bank of memory cells for generating the dummy ATD pulses for the start of sequential read cycles in a respective bank of memory cells.

8. A method according to claim 5, wherein an external protocol signal determines as a function of its own logic state generation of the ATD pulses common to the first and second banks of memory cells for a random mode access to the memory by the switching of the external address line.

9. A method of synchronizing starting of sequential read cycles when reading data in an interleaved memory comprising an array of memory cells being divided into a first bank of memory cells and a second bank of memory cells, the method comprising:

detecting switching of an external address line using an array of address buffers;

providing increment pulses as a function of an external read command to first and second address counters respectively connected to the first and second banks of memory cells, and to first and second pulse generating circuits;

generating an ATD pulse using an array of ATD pulse generators connected to the array of address buffers and being controlled thereby; and generating at least one of a first and a second dummy ATD pulse to be used as a synchronization signal following each increment pulse using the first and second pulse generating circuits.

10. A method according to claim 9, wherein the memory is operating in a synchronous mode with sequential access.

11. A method according to claim 9, further comprising performing logic OR functions using a first logic OR gate having inputs connected to the array of ATD pulse generators for receiving the ATD pulse and an input for receiving the dummy ATD pulse, and a second logic OR function using a second logic OR gate having inputs connected to the array of ATD pulse generators for receiving the ATD pulse and an input for receiving the dummy ATD pulse.

12. A method according to claim 9, wherein the dummy ATD pulse is undistinguishable from the ATD pulse.

13. A method according to claim 9, wherein the increment pulses are distinctly generated for each bank of memory cells for generating the dummy ATD pulses for the start of sequential read cycles in a respective bank of memory cells.

14. A method according to claim 9, wherein an external protocol signal determines as a function of its own logic state generation of the ATD pulses common to the first and second banks of memory cells for a random mode access to the memory by the switching of an external address line.

15. A dummy ATD pulse generator circuit for a memory comprising an array of address buffers, an address counter connected to the array of address buffers, an array of ATD pulse generators connected to the array of address buffers and being controlled thereby for generating an ATD pulse responsive to an external address received by the array of address buffers, and at least one logic gate having inputs connected to the array of ATD pulse generators for receiving the ATD pulse, the dummy ATD pulse generator circuit comprising:

at least one pulse generating circuit for providing a dummy ATD pulse to another input of the at least one logic gate; and a logic circuit for providing increment pulses as a function of an external read command to the address counter and to said at least one pulse generating circuit.

16. A dummy ATD pulse generator circuit according to claim 15, wherein the at least one logic gate comprises a logic OR gate.

17. A dummy ATD pulse generator circuit according to claim 15, wherein the memory is an interleaved memory having an array of memory cells being divided into a first bank of memory cells and a second bank of memory cells with each bank of memory cells including a respective address counter connected thereto.

18. A dummy ATD pulse generator circuit according to claim 17, wherein the at least one logic gate comprises a first logic gate and a second logic gate each having inputs connected to the array of ATD pulse generators for receiving the ATD pulse therefrom; and wherein said at least one pulse generating circuit comprises a first pulse generating circuit for providing a first dummy ATD pulse to another input of the first logic gate, and a second pulse generating circuit for providing a second dummy ATD pulse to another input of the second logic gate.

19. A dummy ATD pulse generator circuit according to claim 17, wherein the increment pulses are distinctly generated for each bank of memory cells for generating the dummy ATD pulses for a start of sequential read cycles in a respective bank of memory cells.

20. A dummy ATD pulse generator circuit according to claim 17, wherein the array of address buffers comprises respective registers connected to address input pads of the memory.

21. A dummy ATD pulse generator circuit according to claim 17, wherein the dummy ATD pulse is undistinguishable from the ATD pulse.

22. An interleaved memory comprising:

an array of memory cells being divided into a first bank of memory cells and a second bank of memory cells;

first and second address counters respectively connected to said first and second banks of memory cells, an array of address buffers connected to said first and second address counters;

an array of ATD pulse generators connected to said array of address buffers and being controlled thereby for generating an ATD pulse responsive to an external address received by said array of address buffers; p1 a first logic gate and a second logic gate each having inputs connected to said array of ATD pulse generators for receiving the ATD pulse therefrom; and a first pulse generating circuit for providing a first dummy ATD pulse to another input of said first logic gate, and a second pulse generating circuit for providing a second dummy ATD pulse to another input of said second logic gate.

23. An interleaved memory according to claim 22, wherein said first and second logic gates each comprises a logic OR gate.

24. An interleaved memory according to claim 22, wherein the increment pulses are distinctly generated for each bank of memory cells for generating the dummy ATD pulses for a start of sequential read cycles in a respective bank of memory cells.

25. An interleaved memory according to claim 22, further comprising address input pads connected to said array of address buffers; and wherein said array of address buffers further comprises respective registers connected to said address input pads.

26. An interleaved memory according to claim 22, wherein the first and second dummy ATD pulses are undistinguishable from the ATD pulse.

* * * * *

UNITED STATES PATENT AND TRADEMARK OFFICE
CERTIFICATE OF CORRECTION

PATENT NO. : 6,625,706 B2
DATED : September 23, 2003
INVENTOR(S) : Campanale et al.

It is certified that error appears in the above-identified patent and that said Letters Patent is hereby corrected as shown below:

<u>Column 8,</u>
Lines 38-44, delete, "an array of ATD pulse generators connected to said array of address buffers and being controlled thereby for generating an ATD pulse responsive to an external address received by said array of address buffers; pl a first logic gate and a second logic gate each having inputs connected to said array of ATD pulse generators for receiving the ATD pulse therefrom; and" insert:
-- an array of ATD pulse generators connected to said array of address buffers and being controlled thereby for generating an ATD pulse responsive
to an external address received by said array of address buffers; a first logic gate and a second logic gate each having inputs connected to said array of ATD pulse generators for receiving the ATD pulse therefrom; and --

Signed and Sealed this

Seventeenth Day of February, 2004

JON W. DUDAS
*Acting Director of the United States Patent and Trademark Office*